United States Patent [19]

Payne

[11] Patent Number: 4,867,757

[45] Date of Patent: * Sep. 19, 1989

[54] LAPPING SLURRY COMPOSITIONS WITH IMPROVED LAP RATE

[75] Inventor: Charles C. Payne, Aurora, Ill.

[73] Assignee: Nalco Chemical Company, Naperville, Ill.

[*] Notice: The portion of the term of this patent subsequent to Jun. 21, 2005 has been disclaimed.

[21] Appl. No.: 242,231

[22] Filed: Sep. 9, 1988

[51] Int. Cl.$^4$ ............................................... B24D 3/00
[52] U.S. Cl. ........................................ 51/293; 51/307; 51/309
[58] Field of Search ........................ 51/293, 307, 309; 260/346.8 R

[56] References Cited

U.S. PATENT DOCUMENTS

| | | | |
|---|---|---|---|
| 2,340,110 | 1/1944 | D'Alelio | 210/24 |
| 2,340,111 | 1/1944 | D'Alello | 210/24 |
| 2,533,635 | 12/1950 | Seymour | 8/62 |
| 2,798,053 | 7/1957 | Brown | 260/2.2 |
| 2,923,692 | 2/1960 | Ackerman et al. | 260/17.4 |
| 3,485,608 | 12/1969 | Cecil | 51/293 |
| 3,618,272 | 11/1971 | Whalen et al. | 51/293 |
| 3,919,258 | 11/1975 | Richardson et al. | 260/346.8 R |
| 4,246,003 | 1/1981 | Regler et al. | 51/293 |
| 4,260,396 | 4/1981 | Glemza | 51/298 |
| 4,769,046 | 9/1988 | Senda et al. | 51/293 |
| 4,773,920 | 9/1988 | Chasman et al. | 51/293 |

OTHER PUBLICATIONS

"Abrasive Technology for Wafer Lapping", by J. A. Dudley, Microelectronic Manufacturing and Testing, Mar. 1986.

"How Users Can Optimize Machine Performance in Production Lapping Operations", by Dr. D. Rostoker, Microelectronic Manufacturing and Testing, pp. 9–10, May 1987.

"Crystallographic Damage to Silicon", by Typical Slicing Lapping, and Polishing Operations, by T. M. Buck & R. L. Meek, NBS Special Publication No. 337, pp. 419–430.

*Primary Examiner*—Paul Lieberman
*Assistant Examiner*—Willie J. Thompson
*Attorney, Agent, or Firm*—John G. Premo; Anthony L. Cupoli; Donald G. Epple

[57] ABSTRACT

A concentrated lapping composition having the following makeup:

| Ingredient | % by Weight |
|---|---|
| Finely divided inorganic abrasive | 5–70 |
| Carboxylic acid dispersant polymer having a molecular weight of from 500–50,000 | 0.1–1 |
| Lubricant | 0.5–29 | said lapping composition having its pH adjusted to greater than 8.5 in order to afford an improved lapping rate.

4 Claims, No Drawings

LAPPING SLURRY COMPOSITIONS WITH IMPROVED LAP RATE

FIELD OF THE INVENTION

The invention is in the field of lapping silicon wafers for the production of silicon chips useful in the electronics industry. More particularly, the invention includes a lapping composition and a method for lapping.

BACKGROUND OF THE INVENTION

In the production of silicon wafers for use in the electronics industry, a number of process steps occur. Generally, a cylinder of silica (i.e. a boule) is produced. Wafers are produced by slicing the boule. The application process creates surface defects which are partially removed by a lapping process. Historically, that lapping process has been accomplished through the use of adhesive. The lapping process is considered to be purely a mechanical process of reducing surface defects.

The reason lapping has been traditionally been considered a mechanical process is best appreciated by looking at the purpose for lapping. These purposes are to remove saw damage created by the slicing operation; to maintain accurate wafer thickness; to maintain and create a flatness and parallelism too the wafer; and to prepare the surface for polishing.

A more complete explanation of lapping is shown in the following articles: "Abrasive Technology for Wafer Lapping", by J. A. Dudley, *Microelectronic Manufacturing and Testing*, March 1986; "How Users Can Optimize Machine Performance in Production Lapping Operations", by Dr. D. Rostoker, *Microelectronic Manufacturing and Testing*, pgs. 9–10, May 1987; and "Crystallographic Damage to Silicon by Typical Slicing, Lapping, and Polishing Operations" by T. M. Buck and R. L. Meek, *NBS Special Publication No.* 337, pgs., 419—30.

This lapping process is traditionally followed by a polishing process. The function of polishing is to provide a highly finished surface suitable for use as a "chip" in the electronics industry. Polishing steps include mechanical polishing using fine abrasives and caustic action brought about by elevation of the polishing composition pH.

After polishing the chip is further processed to include the microcircuitry required by the industry.

The lapping slurries themselves have generally been held at a pH close to neutral. This allows lapping machine operators to manually spread lapping slurries of the wafer being treated. Thus a uniform coating of a coating slurry on the wafer surface is brought about. This machine operator practice is universal.

It would be beneficial if a lapping composition or method could be conceived and produced which would improve on lap rate and/or decrease wafer defects that have been engendered by the cutting operations.

SUMMARY OF THE INVENTION

The applicant has discovered that lap rate is improved by elevating the pH of the lapping slurry. This is contrary to the traditional view that lapping is solely a mechanical process.

The primary advantage of this invention is the recognition that lapping rate can be improved by chemical means. Specifically, by elevation of the pH of a lapping slurry.

Thus, any lapping slurry having the traditional ingredients—an abrasive, a lubricant, and a suspending agent for the abrasive, can be enhanced by elevating the pH. Generally pHs greater than 8.0 will show an effect. Preferably the pH should be greater than 8.5 and most preferably 10.0 or greater.

More specifically a composition of this invention can include the following typical formula as set forth below:

| Ingredients | grams |
|---|---|
| Alumina | 600 |
| Belclene 283 | 4.8 |
| Acrysol 60 | 4.8 |
| Grotan (biocide) | 1.9 |
| Tripotassium phosphate | 12.0 |
| Carbopol 940 | 3.0 |
| Water | 573.5 |

The method of lapping a silicon surface of a pH adjusted lapping composition is also included in the invention. The method preferably will use a composition which has been diluted with water to about 10% abrasive solids. More particularly, the method would include lapping where the abrasive is alumina.

It should be pointed out that the wafer surface is not polished by the pH elevation. The wafer is lapped only and a separate polishing step is required.

Discussion

The applicant filed U.S. Pat. No. 4,752,628 issued June 21, 1988. That application included lapping slurries which were produced at an approximately neutral pH. This was because most lapping slurries were made for the industry with that pH.

Subsequent to conception of the invention of the above patent, the inventor discovered that the lapping rate could be improved through the elevation of pH. The lapping rate was improved for the composition disclosed in U.S. Pat. No. 4,752,628. That patent is herein after incorporated by reference.

In that patent, the composition included a finely divided inorganic abrasive, a lubricant and a vehicle for suspending the abrasive. That vehicle included a combination of polymer thickener and dispersant. Optional ingredients included a biocide and water-soluble corrosion inhibitor. A more particularized explanation of the ingredients is presented below:

| Ingredients | grams |
|---|---|
| Alumina | 600 |
| Belclene 283 | 4.8 |
| Acrysol 60 | 4.8 |
| Grotan (biocide) | 1.9 |
| Tripotassium phosphate | 12.0 |
| Carbopol 940 | 3.0 |
| Water | 573.5 |

Finely Divided Inorganic Abrasive

The finely divided inorganic abrasives used in lapping the silicon wafers are generally precision graded alumina or silicon carbide, alumina being the preferred material. Others that may be used are diamond dust, zirconium oxide, and zirconium silicate. To achieve optimum stability of alumina suspensions as well as high quality wafers, the particle size of these abrasives should be less than 20 microns and preferably less than 15 microns. A typical particle size of 15 microns will produce good cutting rates as well as high quality wafers.

Biocide

The biocide may be any material capable of preventing the growth of microorganisms of the invention. Typical of such biocides would be Grotan which has the chemical composition of hexahydro-1,3,5-tris(2-hydroxyethyl)-s-triazine. Also usable is the biocide Kathon-886 which is a mixture of 75% of 5-chloro-2-methyl-4-isothiazolin-3-one and 25% 2-methyl-4-isothiazolin-3-one.

Carboxylic Acid Dispersant Polymer

These anionic polymers are low molecular weight materials of either acrylic acid, maleic acid, methacrylic acid and the like. They may contain up to 15% by weight of other monomers such as acrylamide.

An important characteristic of these polymers is that they be of relatively low molecular weight, e.g. 500–50,000. A preferred molecular weight range is 1,000–20,000.

A preferred dispersant polymer falling within this description is a polymaleic acid polymer in combination with a low molecular weight acrylic acid emulsion polymer. The polymaleic acid polymer is combined with the acrylic acid emulsion polymer to give an approximate weight ratio on an active polymer basis of about 1:1.

Typical of the polymaleic acid polymers are those described in U.S. Pat. No. 3,919,258, the disclosure of which is incorporated herein by reference. The acrylic acid emulsion polymers are sold commercially under the trade name Acrysol. A typical product would be Acrysol-60 which has an active concentration of polymer of about 28% and a weight average molecular weight weight of 6,000.

Carboxylic Acid Polymer Thickener

Polymers of this type are sold under the trade name Carbopol. These polymers are cross-linked polyacrylic acids that are known to be thickeners. They are water dispersible gels. Polymers of this type are disclosed in U.S. Pat. No. 2,798,053 and U.S. Pat. No. 2,923,692, the disclosure of which is incorporated by reference.

See also, U.S. Pat. Nos. 2,340,110, 2,340,111 and 2,533,635, the disclosures of which is incorporated herein by reference.

Water-Soluble Corrosion Inhibitor

The water-soluble corrosion inhibitor can be selected from a large number of inhibitors use in preventing the corrosion of ferrous metals. A preferred material is potassium phosphate. Other inhibitors that also may be used are the alkanolamines such as triethanolamine, sodium phosphate, molecularly dehydrated phosphates, the organic phosphonates, water-soluble nitrites, and the water-soluble silicates.

Lubricant

Lubricity is supplied by the thickener, the dispersant and the water in which these are dissolved. Additional lubricity can be achieved by adding ingredients selected from the water-soluble glycols such as glycerine, propylene glycol, polyoxyethylene or polyoxypropylene glycols. Such compounds are sold under the trade names Ucon, Carbowaxes, and Pluronics.

The formulas of the invention are sufficiently stable to allow storage and shipment to the end user from a manufacturer or formulator. In certain instances mild agitation may be needed to reform the slurry if any settling occurs. The user, upon receipt of the slurries, would dilute the formulas to use concentrations. Typical use formulations would contain 10–15% by weight of the abrasive particles.

TABLE I

| | | Composition of Lapping Slurries and pH vs. Lapping Rate Improvement | | | | | |
|---|---|---|---|---|---|---|---|
| $Al_2O_3$ Conc. | $Al_2O_3$ Particle Size | % Dispersant and Type | % Biocide and Type | % Thickener and Type | % Accelerator and Type | pH | % Improvement |
| 50% | 15μ | 0.4% Belclene 283 | 0.16% Grotan | 0.4% Acrysol 60 0.3% Carbopol 940 | 1% $K_3PO_4$ | 13.5* | +111% |
| 65% | 7μ | 0.52% Belclene 283 | 0.16% Grotan | 0.16% Carbopol 940 | 2.6% MEA | 10.8 | +107% |
| 65% | 12μ | 0.52% Belclene 283 | 0.16% Grotan | 0.16% Carbopol 940 | 0.3% KOH + 1.3% AEEA | 9.7 | +102% |
| 65% | 15μ | 0.52% Belclene 283 | 0.16% Grotan | 0.16% Carbopol 940 | 1.3% AEEA | 8.5 | +56% |
| 50% | 15μ | 0.52% Belclene 283 | 0.16% Grotan | 0.4% Carbopol 940 | 1.3% $K_3PO_4$ | 8.3 | +42% |

*1% NaOH solution used in place of make-up water

The effect of pH on lap rate can be better appreciated by view of the graph below:

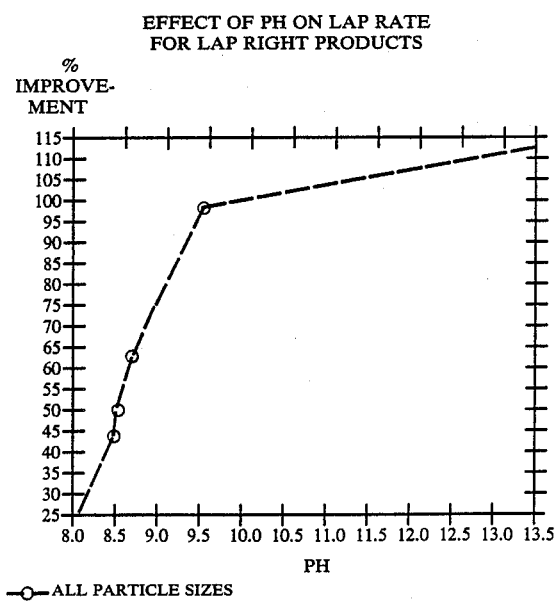

EFFECT OF PH ON LAP RATE
FOR LAP RIGHT PRODUCTS

I claim:

1. A concentrated lapping composition having the following makeup:

| Ingredient | % by Weight |
|---|---|
| Finely divided inorganic abrasive | 5–70 |
| Carboxylic acid dispersant polymer having a molecular weight of from 500–50,000 | 0.1–1 |
| Lubricant | 0.5–29 | said lapping composition having its pH adjusted to a pH greater than 8.5 in order to afford a greater lapping rate.

2. A concentrated lapping composition having the following makeup:

| Ingredient | % by Weight |
|---|---|
| Finely divided inorganic abrasive | 5–70 |
| Carboxylic acid dispersant polymer having a molecular weight of from 500–50,000 | 0.1–1 |
| Lubricant-Cross-linked carboxylic acid gel polymer thickener | 0.5–5 | said lapping composition having its pH adjusted to at least 9.5.

3. A method of lapping a silicon surface with the composition of claim 1 which has been diluted with water to about 10% abrasive solids.

4. The method of claim 3 where the surface is silicon and the abrasive is alumina.

* * * * *